United States Patent [19]

Chern

[11] Patent Number: 5,399,989
[45] Date of Patent: Mar. 21, 1995

[54] VOLTAGE AMPLIFYING SOURCE FOLLOWER CIRCUIT

[75] Inventor: Shy-Shiun Chern, Anaheim, Calif.

[73] Assignee: Rockwell International Corporation, Seal Beach, Calif.

[21] Appl. No.: 804,346

[22] Filed: Dec. 3, 1991

[51] Int. Cl.[6] .............................................. H03F 3/16
[52] U.S. Cl. ..................................... 330/254; 330/277
[58] Field of Search ............... 330/254, 264, 269, 277, 330/282

[56] References Cited

U.S. PATENT DOCUMENTS

| | | | |
|---|---|---|---|
| 5,045,808 | 9/1991 | Taylor | 330/277 |
| 5,083,095 | 1/1992 | Madaffari | 330/277 |
| 5,155,449 | 10/1992 | Ito | 330/277 |

*Primary Examiner*—Mark Hellner
*Attorney, Agent, or Firm*—John C. McFarren

[57] ABSTRACT

A voltage amplifying source follower circuit provides an output gain characteristic greater than unity with low overall noise. The circuit typically comprises a source follower FET with additional FETs to sense the output voltage and change the load current in a direction opposite to a change in the input voltage. In response to an input voltage change, the load current is varied by the source follower circuit so that the corresponding output voltage change is amplified beyond that of the input voltage change. By varying the load current in a direction opposite to the effect of a load resistance, the source follower gain is increased to greater than unity. When the input voltage increases, the output voltage increases even more because the load current is decreased correspondingly. The compact amplifying circuit can be fabricated on an integrated circuit chip outside critical unit cell areas of a focal plane array.

13 Claims, 2 Drawing Sheets

VOLTAGE AMPLIFYING SOURCE FOLLOWER CIRCUIT

GOVERNMENT RIGHTS

The United States Government has rights in this invention under contract number F29601-88-C-0075 awarded by the Department of the Air Force.

TECHNICAL FIELD

The present invention relates to electrical source follower circuits and, in particular, to a source follower circuit having additional FETs to control the load current and produce a voltage gain greater than unity.

BACKGROUND OF THE INVENTION

In many state of the art integrated circuits, emphasis is placed on providing signal amplification with low noise and low power dissipation. There are continuous demands for circuit improvements that enable higher functional throughput, increased on-chip signal processing, higher data rates, lower noise, less power dissipation, smaller cell size, and greater radiation hardness. In general, improved unit cell designs are needed to maximize functionality and provide high gain while minimizing noise, power dissipation, and cell size. Unfortunately, increased unit cell functionality usually requires greater circuit complexity, which leads to more noise and increased power dissipation. These conflicting requirements stretch the capabilities of state of the art electronic circuit designs.

Specifications for advanced Focal Plane Array (FPA) detectors, for example, require sensing of very low signal levels. For a detector system to maintain good sensitivity and resolution, the readout device of the FPA must amplify input signals received at the noise equivalent input (NEI) photon level so that the output signals are above the noise floor of the multiplexer and data processing electronics that follow the FPA. In some FPA applications, the sensor is required to perform in a low flux background while coveting a wide dynamic range. With these increasingly stringent specifications, state-of-the-art technology suffers from high stray capacitance and low source follower gain. The traditional approach to these problems has been simply to optimize the circuit layout and the device fabrication process.

A basic source follower circuit comprises an FET, with its drain biased at a fixed voltage, and a current load, which is generally supplied externally. Source followers are widely used as buffers to match a signal having a high output impedance and a load having a low input impedance. Although a source follower contributes significantly to the function of signal power amplification, it is generally not considered to be an amplifier because of its less than unity voltage gain characteristic.

Source follower operation using MOS technology is based on a single MOSFET, which is a four-terminal device. The gate-to-source voltage is the primary determinate of the conductivity between the drain and source. Because of the intimate physical contact between substrate and source, which actually forms a diode, the substrate potential with respect to the source affects the current because of a change in threshold voltage. This substrate-to-source voltage influence is known as the "body effect." In a basic source follower configuration with a constant current load ($I_L$), a drain voltage ($V_D$), a source voltage ($V_S$), and an established FET gate bias ($V_g$), as illustrated in FIG. 1A, gate and source voltages must track each other to maintain a constant current. As the gate voltage ($V_g$) changes, the source voltage ($V_S$) must change proportionally in the same direction (except for an offset caused by the body effect). If the gate is considered as an input and the source as an output of an electrical network, the source follows the gate's action. The body effect, however, causes a reduction in the $V_S$ changes with respect to the $V_g$ changes. Thus, the voltage gain is less than unity.

In some cases, when the substrate of the source follower FET is not shared with other FETs, it is possible to tie the source and substrate together, either directly, as illustrated in FIG. 1B, or indirectly through a voltage supply. In this configuration, the substrate-to-source voltage remains fixed and no reduction in voltage gain occurs from the body effect. However, the "source" (including the substrate) is physically much more massive and therefore requires more power to change its potential. This results in a trade-off of speed versus power. Furthermore, an isolated substrate structure is generally not supported by fabrication process technology. In another configuration, as illustrated in FIG. 1C, a resistive load ($R_L$) can be used for convenience instead of a current load. A resistive load, however, contributes to gain degradation. Because the drain voltage is held constant, a secondary conductivity change, due to the FET channel length modulation when $V_S$ changes with respect to $V_D$, also leads to gain degradation. All of these effects can be minimized using circuit design techniques, but minimization of the body effect is technologically limited. Therefore, the best source follower gain value achievable in the prior art is approximately 0.9.

In MOS technology, the source follower is a very popular electrical circuit building block because of its simplicity and it functional capability. However, the less than unity gain performance adds to noise susceptibility because signals are suppressed more than noise injected into the signal path. Furthermore, the inherent gain degradation limits the number of source follower stages that can be used in a circuit before signals have to be increased by a greater than unity voltage amplifier. An added amplifier, however, significantly increases cell size and complexity as well as power dissipation. The amplifier also tends to behave as an additional noise source. Thus, an amplifier, which is added to improve noise performance, is somewhat self-defeating in that it contributes to the noise of the circuit. In view of these factors, there is an identified need for a source follower circuit that has gain performance greater than unity and that does not add to overall circuit noise and power requirements.

SUMMARY OF THE INVENTION

The present invention comprises a circuit, typically in a compact source follower configuration, that provides voltage amplification and achieves overall noise reduction. A typical circuit of the present invention includes a source follower with additional FETs to sense the output voltage and control the load current. The FETs are connected in the circuit to produce changes in the load current proportional to changes in the input signal. By varying the load current in a direction opposite to the effect of a load resistance, the source follower gain is increased to greater than unity. In response to a gate voltage change, the load current is varied for the circuit so that the corresponding source voltage change is amplified beyond that of the gate voltage change. Thus, when the gate voltage increases, the source voltage increases even more because the load current is decreased correspondingly. The amplifying source follower is useful in a readout circuit for an infrared Focal Plane Array detector, for example, where the additional FETs may be placed outside the critical unit cell areas on an integrated circuit chip.

A principal object of the invention is to provide a compact source follower circuit having a gain characteristic greater than unity. A feature of the invention is the use of additional FETs in a conventional source follower circuit to sense the output voltage and control the load current so as to enhance the source follower gain. An advantage of the invention is the provision of a voltage amplifying source follower that reduces noise and power requirements of an FPA readout circuit and that can be easily fabricated on an integrated circuit chip.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

The present invention comprises a compact source follower circuit having enhanced gain characteristics. From the characteristic of a conventional source follower FET 21 of FIG. 2, the load current ($I_L$) is given by:

$$I_L = K_{21}(V_{21} - x\, V_g)^2,$$

where $V_{21}$ is the quiescent point (i.e., $V_g - V_S - V_{th}$, the gate-to-source voltage with respect to threshold) of the source follower FET 21; $K_{21}$ is the conductivity coefficient of FET 21; and $x\, V_g$ is the voltage signal (i.e., $V_{sig}$) applied to the gate of FET 21 expressed in terms of a fraction ($x$) of the gate bias voltage, $V_g$. Source follower FET 21 may comprise an element of an FPA readout circuit unit cell, for example. The principle of the invention is that by varying the load current in a direction opposite to the effect of a load resistance, the source follower gain can be increased to greater than unity. In response to a gate voltage change, the load current is varied for the source follower circuit so that the corresponding source voltage change is amplified beyond that of the gate voltage change. Thus, when the gate voltage increases (or decreases), the source voltage increases (decreases) even more because the load current is decreased (increased) correspondingly.

Figure 1A:
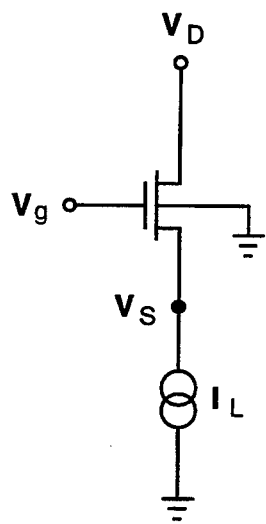
FIGS. 1A–C are schematic diagrams of prior art source follower circuits.
Figure 1B:
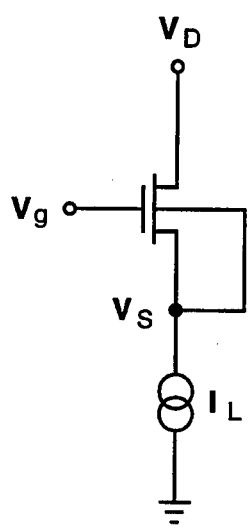
Figure 1C:
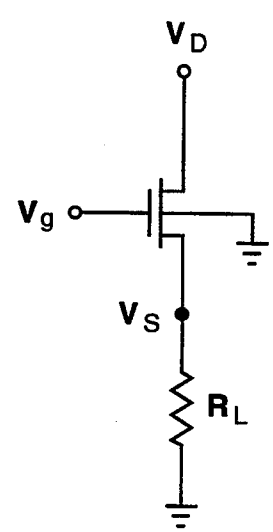
Figure 2:
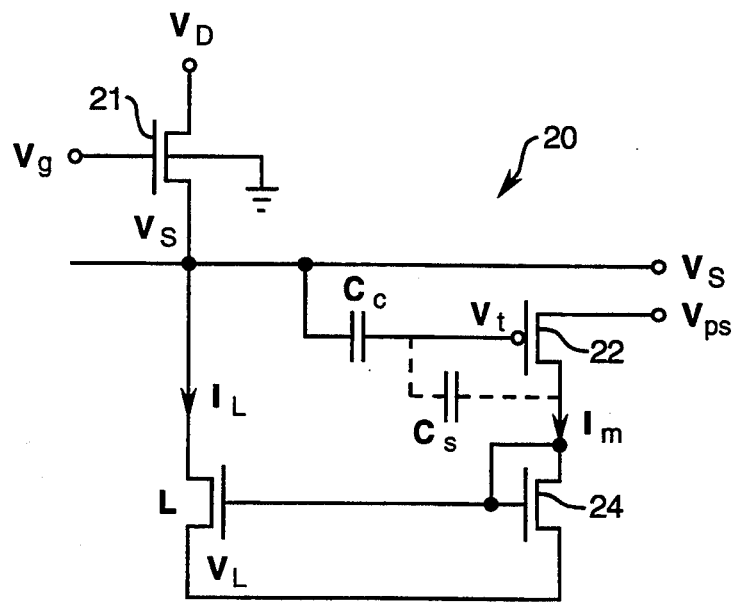
FIG. 2 is a schematic diagram of a source follower circuit of the present invention having two additional FETs.

One embodiment of a source follower circuit 20 of the present invention is illustrated schematically in the diagram of FIG. 2. Circuit 20 includes PFET 22, NFET 24, and voltage coupling capacitor $C_c$ added to a current load L connected to conventional source follower FET 21. The source of PFET 22 is biased with a fixed voltage $V_{ps}$. PFET 22 is used to sense the source voltage $V_S$ of source follower FET 21 through capacitor $C_c$. Capacitor $C_c$ forms a voltage divider along with stray capacitance $C_s$. As a result, the signal $V_t$ at the gate of PFET 22 is only a fraction of voltage $V_S$. Also, because $V_S$ is a function of $V_g$ (scaled by the gain of source follower FET 21), $V_t$ is a fraction $y$ of $V_g$. The current $I_m$ through PFET 22 varies inversely with $V_t$ such that:

$$I_m = K_{22}(V_{22} - y\, V_g)^2,$$

where $K_{22}$ is the conductivity coefficient of PFET 22 and $V_{22}$ is the quiescent point of PFET 22. NFET 24 is connected in series with PFET 22 and functions as a current mirror (having mirror gain $K_{24}$) with load L connected to source follower FET 21. Therefore, current load $I_L$ of source follower FET 21 is equal to $K_{24}$ times $I_m$ and can be expressed in terms of $V_g$ as follows:

$$I_L = K_{24} I_m = K_{24} K_{22}(V_{22} - y\, V_g)^2,$$

which must be equal to the first equation expressed above. Comparing these equations and considering $V_g$ as a variable, it can be seen that the condition $K_{24} K_{22} V_{22}^2 = K_{21} V_{21}^2$ must be met. This condition can be satisfied by adjusting $V_{ps}$, which affects the quiescent point $V_{22}$ of PFET 22. Under this condition, it follows that:

$$x^2 = y^2 K_{24} K_{22} / K_{21}.$$

The foregoing equation shows that one can design for any value of $x$ (in the first equation for source follower FET 21) by properly choosing device parameters $y$, $K_{24}$, and $K_{22}$ in source follower circuit 20. As long as $y$ is greater than zero, one can cause the source voltage $V_S$ to react more than merely following the gate voltage $V_g$. In practical applications, a source follower circuit need not have a gain greatly in excess of 1 to be beneficial. When applied to an amplifier circuit, for example, the small gain improvement provided by the source follower circuit of the present invention allows the use of easier to produce amplifier components to generate an overall circuit gain that would be otherwise difficult to attain. Thus, the source follower circuit of the present invention is an important building block that provides low noise, voltage and power gain, and characteristics useful for improving the performance of other circuit building blocks.

Figure 3:
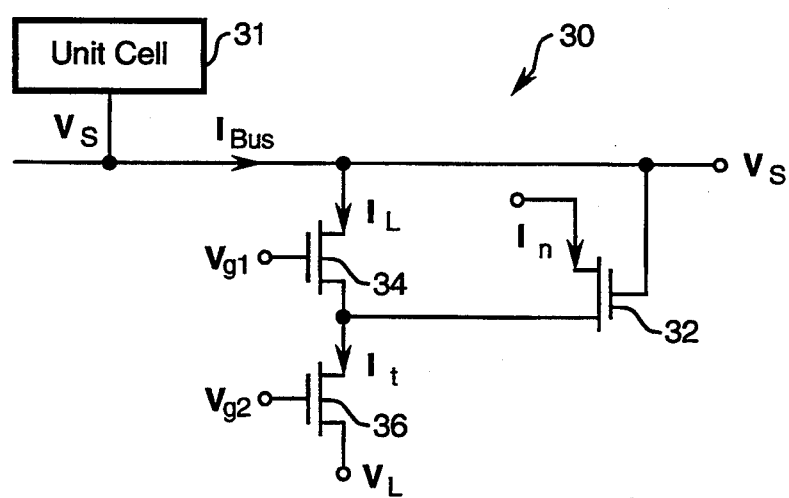
FIG. 3 is a schematic diagram of an alternative source follower circuit of the present invention comprising NFETs.

Another embodiment of the present invention is illustrated in FIG. 3. Source follower circuit 30 is shown connected to a current bus ($I_{Bus}$) of an infrared focal plane array (FPA) detector. In particular, source follower circuit 30 is designed for connection to a "virtual amplifier" circuit as described in U.S. patent application Ser. No. 622,467 filed Dec. 5, 1990, by Shy-Shiun Chern. The virtual amplifier was designed as a readout cell for FPA detectors, but it is applicable to any large scale integrated circuit where amplification of a signal on a reference node must be performed with a cell of small size that produces low noise and low power dissipation. The virtual amplifier utilizes a switched FET and a source follower to switch between two different values of capacitance. Each capacitance is optimized to satisfy conflicting requirements for different timing periods, i.e., integration and read-out, without using a traditional buffering device such as a conventional amplifier. A conventional amplifier is undesirable in this application because it would increase circuit complexity, noise, power consumption, and space requirements. Source follower circuit 30 (or circuit 20) may be used with the unit cells, such as unit cell 31, of a virtual amplifier to provide source follower gain greater than unity and thereby remove the minimum limit on the value of $C_{read}$ without any changes in the process technology.

As shown in FIG. 3, a saturation condition is assumed in which the relationship of load current ($I_L$) to gate-to-source voltage ($V_S$) is linear. In this condition, the desired load current characteristic (i.e., the inverse $V_g$ dependence) can be obtained by subtracting a $V_g$-dependent current $I_n$ (through FET 32) from constant current $I_t$ (through FET 36). In the current subtraction method used by source follower circuit 30, both circuit layout and process technology are simplified because circuit 30 uses only NFETs.

The foregoing embodiments of the invention, as illustrated in FIGS. 2 and 3, are shown connected to the source of an output FET (such as FET 21 or unit cell 31) to sense the signal and control the load current. However, the amplifying circuit of the present invention is equally suited for connection to an input node or other node of a given circuit to sense and amplify a signal other than an output of a source follower FET. For example, circuit 20 may be connected to sense input signal $V_g$ of FET 21 directly instead of sensing output signal $V_S$.

Although the present invention has been described with respect to a specific embodiment thereof, various changes and modifications may be suggested to one skilled in the art. For example, the concept of sensing the output voltage and controlling the load current can be achieved using many different circuit configurations (including connection to nodes for sensing and amplifying signals other than a source follower output), thus providing flexibility and added capability in VLSI circuit design. Therefore, it is intended that the present invention encompass such changes and modifications as fall within the scope of the appended claims.

I claim:

1. A voltage amplifying circuit, comprising:
    means for receiving an input voltage, providing an output voltage having a gain with respect to said input voltage, and generating a load current;
    means connected to said receiving means for sensing changes in said input voltage; and
    means connected to said sensing means for varying said load current in a direction opposite to said sensed change in said input voltage, said load current varying means thereby driving said output voltage gain to greater than unity.

2. The voltage amplifying circuit of claim 1, wherein said receiving means comprises a source follower FET having a gate and a source, and wherein said input voltage is applied to said gate to produce a source voltage as said output voltage.

3. The voltage amplifying circuit of claim 2, wherein: said sensing means comprises a second FET connected to said source follower FET
    for sensing changes in said source voltage; and said varying means comprises a third FET connected to said second FET for
    varying said load current in a direction opposite said sensed source voltage change.

4. The voltage amplifying circuit of claim 3, wherein:
    a gate of said second FET is connected to said source of said source follower FET for sensing said changes ill said source voltage; and said third FET is further connected to a load FET for varying said load current.

5. The voltage amplifying circuit of claim 4, wherein said load FET is connected to said source of said source follower FET and said third FET is connected to a gate of said load FET for varying said load current.

6. An amplifying source follower circuit, comprising:
    a source follower FET having a gate and a source;
    a signal voltage applied to said gate for producing a source voltage having a gain with respect to said signal voltage;
    a load connected to said source, said source voltage generating a load current; a second FET connected to said source follower FET to sense a change in said source voltage produced by a corresponding change in said signal voltage; and
    a third FET connected to said second FET for varying said load current in a direction opposite said sensed source voltage change, thereby driving said source voltage gain to greater than unity.

7. The amplifying source follower circuit of claim 6, wherein: a gate of said second FET is connected to said source of said source follower FET
    for sensing said changes in said source voltage; and
        said third FET is further connected to said load
    for varying said load current.

8. The amplifying source follower circuit of claim 7, wherein said load comprises a load FET and said third FET is connected to a gate of said load FET for varying said load current.

9. The amplifying source follower circuit of claim 7, further comprising a unit cell of an infrared focal plane array detector connected for applying said signal voltage to said gate of said source follower FET.

10. A method of producing greater than unity gain in a low noise source follower circuit, comprising the steps of:
    providing a source follower FET having a gate and a source connected to a load;
    applying an input voltage to said gate of said source follower FET;
    producing an output voltage at said source of said source follower FET, said output voltage having a gain with respect to said input voltage;
    generating a load current;
    sensing a change in said input voltage; and
    varying said load current in a direction opposite said sensed input voltage change, thereby driving said output voltage gain to greater than unity.

11. The method of claim 10, wherein the step of sensing a change in said input voltage comprises connecting a gate of a second FET to said source of said source follower FET for sensing said output voltage.

12. The method of claim 11, wherein the step of varying said load current comprises connecting a third FET between said second FET and a load FET comprising said load.

13. The method of claim 12, wherein the step of connecting said third FET comprises connecting said third FET to a gate of said load FET for varying said load current.

* * * * *